(12) United States Patent
Choi et al.

(10) Patent No.: US 9,520,198 B2
(45) Date of Patent: Dec. 13, 2016

(54) SEMICONDUCTOR MEMORY DEVICE INCLUDING THREE-DIMENSIONAL MEMORY CELL ARRAY STRUCTURE AND OPERATING METHOD THEREOF

(71) Applicant: SK hynix Inc., Gyeonggi-do (KR)

(72) Inventors: Se Kyoung Choi, Chungcheongbuk-do (KR); Eun Seok Choi, Gyeonggi-do (KR); Jung Seok Oh, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 8 days.

(21) Appl. No.: 14/570,813

(22) Filed: Dec. 15, 2014

(65) Prior Publication Data

US 2016/0027520 A1 Jan. 28, 2016

(30) Foreign Application Priority Data

Jul. 25, 2014 (KR) .......................... 10-2014-0094817

(51) Int. Cl.
*G11C 16/24* (2006.01)
*G11C 7/14* (2006.01)
*G11C 16/08* (2006.01)
*G11C 16/34* (2006.01)

(52) U.S. Cl.
CPC ................. *G11C 16/24* (2013.01); *G11C 7/14* (2013.01); *G11C 16/08* (2013.01); *G11C 16/3427* (2013.01)

(58) Field of Classification Search
CPC ................................. G11C 16/24; G11C 16/04
See application file for complete search history.

(56) References Cited

U.S. PATENT DOCUMENTS

| | | | | |
|---|---|---|---|---|
| 2002/0114187 A1* | 8/2002 | Choi | ...................... | G11C 16/12 365/185.17 |
| 2005/0057967 A1* | 3/2005 | Khalid | ............... | G11C 16/3468 365/185.02 |
| 2009/0207657 A1* | 8/2009 | Tamada | .............. | G11C 11/5628 365/185.03 |
| 2010/0172182 A1* | 7/2010 | Seol | ..................... | G11C 11/5628 365/185.17 |
| 2012/0182809 A1* | 7/2012 | Dutta | .................. | G11C 11/5628 365/185.18 |
| 2013/0182505 A1* | 7/2013 | Liu | ........................ | G11C 16/10 365/185.17 |

FOREIGN PATENT DOCUMENTS

| | | |
|---|---|---|
| JP | 2011-065723 | 3/2011 |
| KR | 1020120000900 | 1/2012 |
| KR | 1020130087857 | 8/2013 |

* cited by examiner

*Primary Examiner* — Douglas King
(74) *Attorney, Agent, or Firm* — IP & T Group LLP

(57) ABSTRACT

An operating method includes biasing channel regions of unselected cell strings among the cell strings to an initial voltage while applying a first pass voltage to the plurality of word lines; floating the channel regions of the unselected cell strings; increasing the first pass voltage to a second pass voltage during the floating of the channel regions; and reading data from selected memory cells of selected cell strings among the cell strings.

20 Claims, 11 Drawing Sheets

FIG. 4
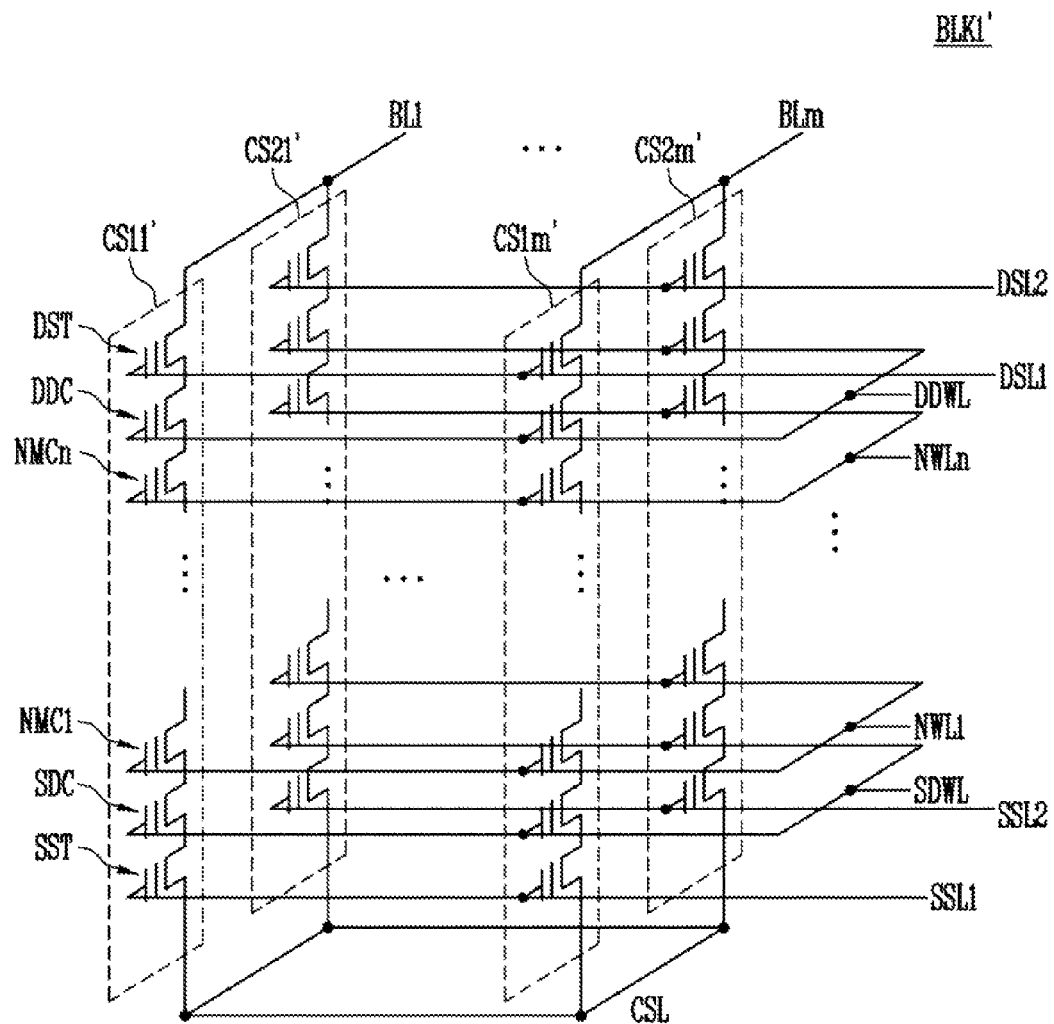
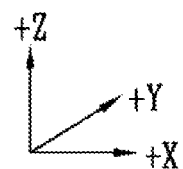

SEMICONDUCTOR MEMORY DEVICE INCLUDING THREE-DIMENSIONAL MEMORY CELL ARRAY STRUCTURE AND OPERATING METHOD THEREOF

CROSS-REFERENCE TO RELATED APPLICATION

The present application claims priority to Korean patent application number 10-2014-0094817, filed on Jul. 25, 2014, the entire disclosure of which is incorporated herein in its entirety by reference.

BACKGROUND

Field of Invention

Various exemplary embodiments of the present invention relate generally to an electronic device, and more particularly, to a semiconductor memory device including a three-dimensional memory cell array structure and an operating method thereof.

Semiconductor memory devices are embodied with semiconductors such as silicon (Si) germanium (Ge), gallium arsenide (GaAs), or indium phosphide (Inp). Semiconductor memory devices are classified into volatile memory devices and non-volatile memory devices.

Volatile memory devices lose stored data when the power is off. Examples of volatile memory devices include Static RAM (SRAM), Dynamic RAM (DRAM) and Synchronous DRAM (SDRAM). Non-volatile memory devices can retain stored data regardless of power on/off conditions. Examples of non-volatile memory include Read Only Memory (ROM), Mask ROM (MROM), Programmable ROM (PROM), Erasable Programmable ROM (EPROM), Electrically Erasable and Programmable ROM (EEPROM), flash memory, Phase-change Random Access Memory (PRAM), Magnetic RAM (MRAM), Resistive RAM (RRAM) and Ferroelectric RAM (FRAM). Flash memories may be classified into NOR-type memories and NAND-type memories.

SUMMARY

The present invention is directed to a semiconductor memory device having improved reliability, and an operating method thereof.

An operating method of a three-dimensional semiconductor memory device including cell strings each having memory cells stacked over a substrate and coupled to a plurality of word lines, according to an embodiment of the present invention, may include biasing channel regions of unselected cell strings among the cell strings to an initial voltage while applying a first pass voltage to the plurality of word lines; floating the channel regions of the unselected cell strings; increasing the first pass voltage to a second pass voltage during the floating of the channel regions; and reading data from selected memory cells of selected cell strings among the cell strings.

The increasing may increase the first pass voltage to the second pass voltage so that potentials of the channel regions of the unselected cell strings may be boosted in proportion to an increment from the first pass voltage to the second pass voltage.

The cell strings may be coupled between bit lines and a common source line, and the floating may electrically separate the channel regions of the unselected cell strings from the bit lines and the common source line.

The cell strings may be coupled between bit lines and a common source line, and the biasing may include applying the initial voltage to the bit lines, and electrically connecting the channel regions of the unselected cell strings to the bit lines thereby transferring the initial voltage to the channel regions of the unselected cell strings.

The biasing may further include applying the first pass voltage to the plurality of word lines after the electrical connecting.

The cell strings may be coupled between bit lines and a common source line, and the biasing may include applying the initial voltage to a common source line, and electrically connecting the channel regions of the unselected cell strings to the common source line, thereby transferring the initial voltage to the channel regions of the unselected cell strings.

The biasing may further include applying the first pass voltage to the plurality of word lines after the electrical connecting.

The cell strings may be coupled between bit lines and a common source line, and the biasing may include applying the initial voltage to both of the bit lines and the common source line, and electrically connecting the channel regions of the unselected cell strings to both of the bit lines and the common source line, thereby transferring the initial voltage to the channel regions of the unselected cell strings.

The reading may keep the channel regions of the unselected cell strings floated.

The reading may keep applying the second voltage to unselected word lines among the plurality of word lines, and apply a read voltage to a selected word line among the plurality of word lines, and the first and second pass voltages may be greater than the read voltage.

The biasing may provide the initial voltage to channel regions of the selected cell strings, and the floating may keep providing the initial voltage to the channel regions of the selected cell strings.

The cell strings may be coupled between bit lines and a common source line, and the biasing may include applying the initial voltage to the bit lines, and electrically connecting channel regions of the cell strings to the bit lines.

The floating may electrically separate the unselected cell strings from both of the bit lines and the common source line, and electrically couple the selected cell strings to the bit lines.

The cell strings may be coupled between bit lines and a common source line, and the biasing may include applying the initial voltage to the common source line, and electrically connecting channel regions of the cell strings to the common source line.

The floating may electrically separate the unselected cell strings from both of the bit lines and the common source line, and electrically couple the selected cell strings to the common source line.

An aspect of the present invention relates to a semiconductor memory device. A semiconductor memory device according to an embodiment of the present invention may include cell strings including memory cells stacked over a substrate and coupled to a plurality of word lines, and a peripheral circuit coupled to the cell strings through the plurality of word lines, and suitable for setting channel regions of unselected cell strings among the cell strings before a read operation, wherein the peripheral circuit biases the channel regions of the unselected cell strings to an initial voltage while applying a first pass voltage to the plurality of word lines; floats the channel regions of the unselected cell strings; and increases the first pass voltage to a second pass voltage.

The cell strings may be coupled between bit lines and a common source line, and the peripheral circuit may float the channel regions of the unselected cell strings by electrically separating the channel regions of the unselected cell strings from the bit lines and the common source line.

The cell strings may be coupled between bit lines and a common source line, and the peripheral circuit may bias the channel regions of the unselected cell strings to the initial voltage by applying the initial voltage to the bit lines, and by electrically connecting the channel regions of the unselected cell strings to the bit lines.

The cell strings may be coupled between bit lines and a common source line, and the peripheral circuit may bias the channel regions of the unselected cell strings to the initial voltage by applying the initial voltage to the common source line, and by electrically connecting the channel regions of the unselected cell strings to the common source line.

The cell strings may be coupled between bit lines and a common source line, and the peripheral circuit may bias the channel regions of the unselected cell strings to the initial voltage by applying the initial voltage to both of the bit lines and the common source line, and by electrically connecting the channel regions of the unselected cell strings to the bit lines and the common source line.

BRIEF DESCRIPTION OF THE DRAWINGS

FIG. 4 is a circuit diagram illustrating another example of a memory block shown in FIG. 2;

DETAILED DESCRIPTION

Figure 1:
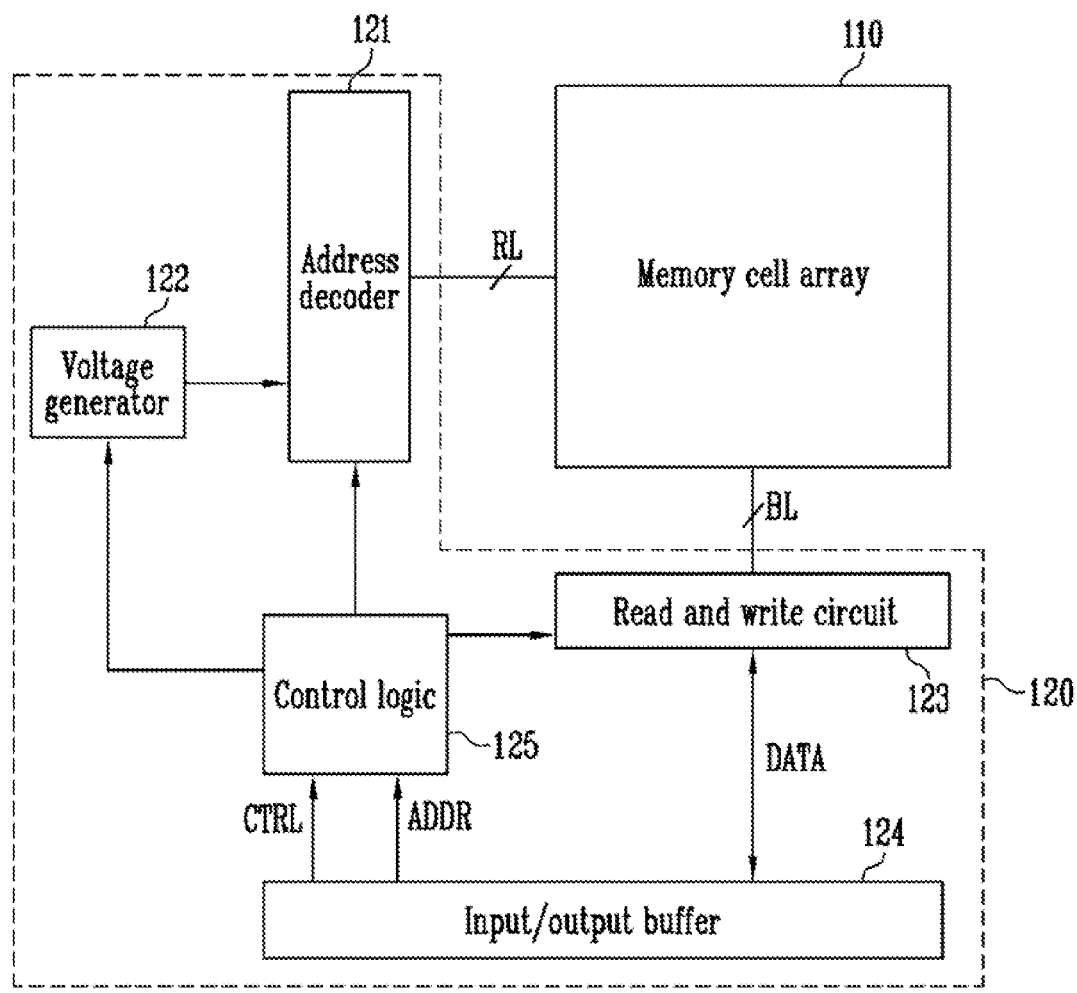
FIG. 1 is a block diagram illustrating a semiconductor memory device in accordance with an exemplary embodiment of the present invention.

Hereinafter, various embodiments will be described in detail with reference to the accompanying drawings. The figures are provided to allow those with ordinary skill in the art to understand the scope of the embodiments of the invention. The present invention may, however, be embodied in different forms and should not be construed as limited to the embodiments set forth. Rather, these embodiments are provided so that this disclosure will be thorough and complete. In addition, the embodiments are provided to fully convey the scope of the invention to those skilled in the art.

Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form, and vice versa, as long as it is not specified.

FIG. 1 is a block diagram illustrating a semiconductor memory device 100 in accordance with an exemplary embodiment of the present invention.

Referring to FIG. 1, the semiconductor memory device 100 may include a memory cell array 110 and a peripheral circuit 120. The peripheral circuit 120 may include an address decoder 121, a voltage generator 122, a read and write circuit 123, an input/output buffer 124 and a control logic 125.

The memory cell array 110 may be coupled to the address decoder 121 through row lines RL. The memory cell array 110 may be coupled to the read and write circuit 123 through bit lines BL.

The memory cell array 110 may include a plurality of memory blocks. Each of the plurality of memory blocks may include a plurality of cell strings. Each of the cell strings may include a plurality of memory cells stacked over a substrate. According to an embodiment, the plurality of memory cells may be non-volatile memory cells. According to an embodiment, each of the plurality of memory cells may be defined as a single level cell or multi level cells. The memory cell array 110 will be described in detail with reference to FIGS. 2 to 4.

The address decoder 121 may be coupled to the memory cell array 110 through the row lines RL. The row lines RL may include drain selection lines, word lines, source selection lines and a common source line. The word lines may include dummy word lines and normal word lines. The dummy word lines may include one or more source side dummy word lines and one or more drain side dummy word lines. According to an embodiment, the row lines RL may include a pipe line.

The address decoder 121 may control the row lines RL in response to control of the control logic 125. The address decoder 121 may apply various voltages from the voltage generator 122 to the row lines RL in response to the control logic 125.

The address decoder 121 may receive an address ADDR from the control logic 125.

According to an embodiment, a program operation and a read operation of the semiconductor memory device 100 may be performed in units of pages. During the program operation and the read operation, the address ADDR may include a block address and a row address. The address decoder 121 may decode the block address of the received address ADDR. The address decoder 121 may select one of the memory blocks in response to the decoded block address. The address decoder 121 may decode the row address of the received address ADDR. The address decoder 121 may select one of the drain selection lines of a selected memory block in response to the decoded row address, and select one of the source selection lines of the selected memory block and one of the word lines of the selected memory block. Therefore, memory cells corresponding to a single page may be selected.

According to an embodiment, the address decoder 121 may include a block decoder, a row decoder and an address buffer.

The control logic 125 may control the voltage generator 122. The voltage generator 122 may generate an internal power voltage by using an external power voltage provided to the semiconductor memory device 100. For example, the voltage generator 122 may regulate the external power voltage to generate an internal power voltage. The generated internal power voltage may be provided to an address decoder 121, the read and write circuit 123, the input/output buffer 124 and the control logic 125 and used as an operating voltage of the semiconductor memory device 100.

The voltage generator 122 may generate a plurality of voltages by using one or more of the external power voltage and the internal power voltage. According to an embodiment, the voltage generator 122 may include a plurality of pumping capacitors receiving the internal power voltage and generate a plurality of voltages by selectively activating the plurality of pumping capacitors in response to control of the control logic 125. For example, the voltage generator 122 may generate a plurality of voltages to be applied to the row lines RL and provide the generated voltages to the address decoder 121.

The read and write circuit 123 may be coupled to the memory cell array 110 through the bit lines BL. The read and write circuit 123 may be controlled by the control logic 125. The read and write circuit 123 may bias the voltages provided from the voltage generator 122 to bit lines BL1 to BLm in response to the control logic 125.

During the read operation, the read and write circuit 123 may read data DATA from selected memory cells through the bit lines BL and output the read data DATA to the input/output buffer 124. During the program operation, the read and write circuit 123 may transfer the data DATA from the input/output buffer 124 to the bit lines BL. The selected memory cells may be programmed in response to the transferred data DATA.

According to an embodiment, the read and write circuit 123 may include page buffers or page registers, and a column selection circuit.

The control logic 125 may be coupled to the address decoder 121, the voltage generator 122, the read and write circuit 123 and the input/output buffer 124. The control logic 125 may receive a control signal CTRL and the address ADDR from the input/output buffer 124. The control logic 125 may control the general operation of the semiconductor memory device 100 in response to the control signal CTRL. The control logic 125 may transfer the address ADDR to the address decoder 121.

According to an embodiment, the control logic 125 may control the address decoder 121 and the read and write circuit 123 to set channel regions of unselected cell strings of the selected memory block before the read operation. This will be described in detail with reference to FIGS. 5 to 11.

The input/output buffer 124 may receive the control signal CTRL and the address ADDR from an external device and transfer the received control signal CTRL and address ADDR to the control logic 125. In addition, the input/output buffer 124 may transfer the externally received data DATA to the read and write circuit 123, or output the data DATA received from the read and write circuit 123 to an external device.

According to an embodiment, the semiconductor memory device 100 may be a flash memory device.

Figure 2:
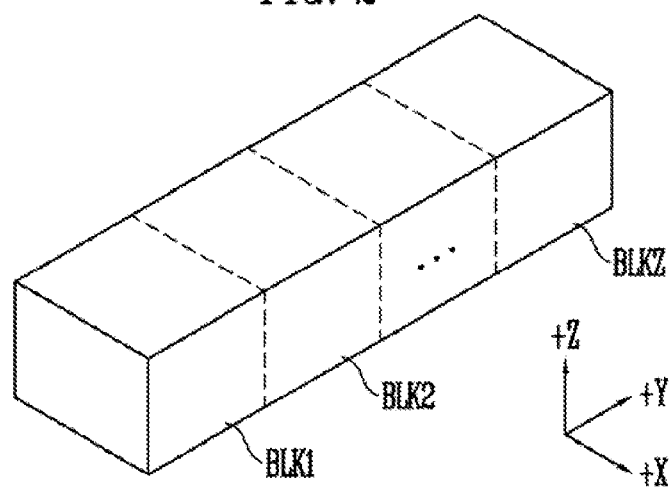
FIG. 2 is a schematic diagram illustrating an example of a memory cell array shown in FIG. 1.

FIG. 2 is a schematic diagram illustrating an example of the memory cell array 110 shown in FIG. 1.

Referring to FIG. 2, the memory cell array 110 may include a plurality of memory blocks BLK1 to BLKz. The memory blocks BLK1 to BLKz may be the same as one another. Each of the memory blocks may have a three-dimensional structure. Each memory block may include a plurality of memory cells stacked over the substrate. The plurality of memory cells may be arranged in +X direction, +Y direction and +Z direction. The structure of each memory block is described in detail with reference to FIGS. 3 and 4.

Figure 3:
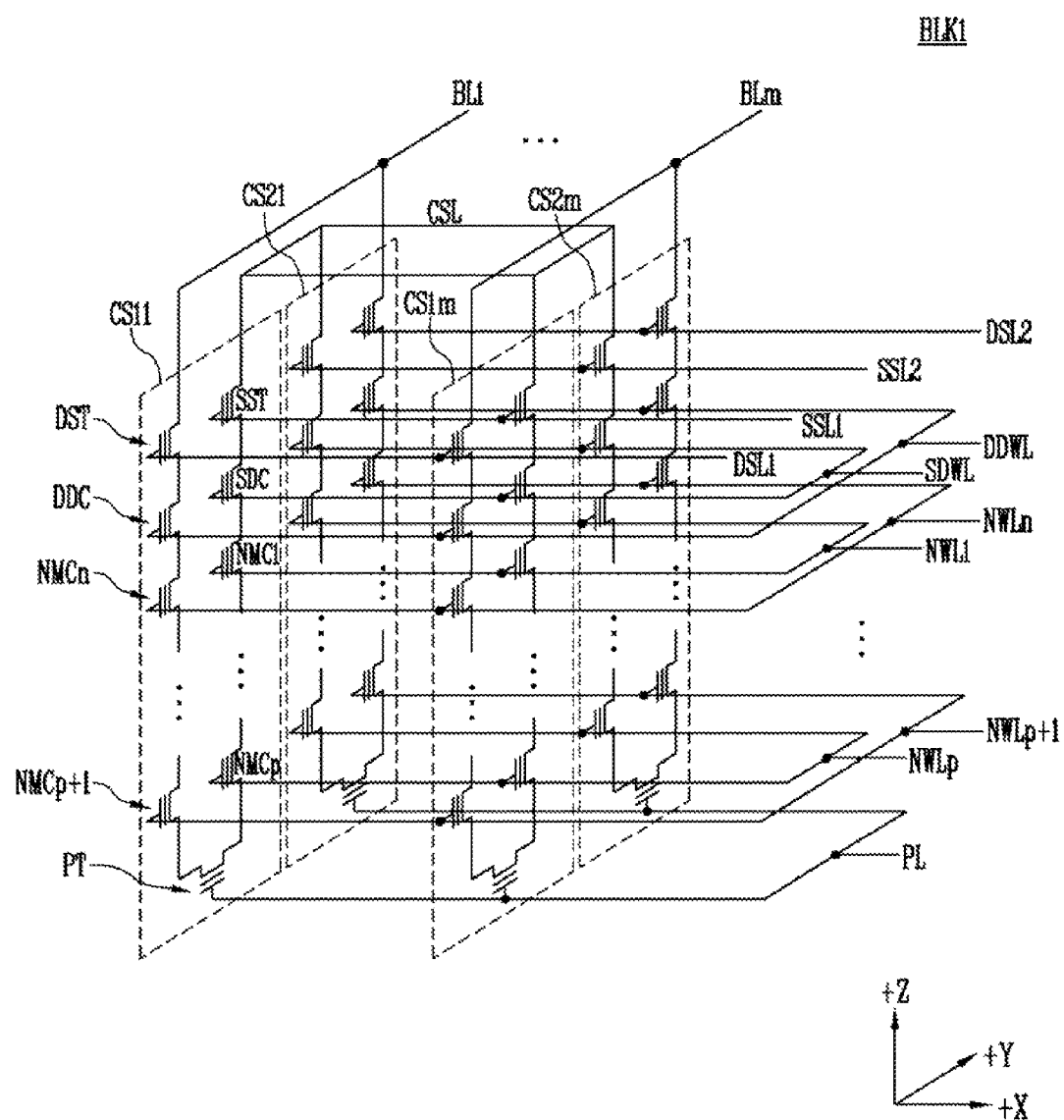
FIG. 3 is a circuit diagram illustrating an example of a memory block shown in FIG. 2.

FIG. 3 is a circuit diagram illustrating an example of the first memory block BLK1 shown in FIG. 2.

Referring to FIG. 3, the first memory block BLK1 may include a plurality of cell strings CS11 to CS1$m$ and CS21 to CS2$m$. Each of the cell strings CS11 to CS1$m$ and CS21 to CS2$m$ may be formed in a 'U' shape. In the first memory block BLK1, m-numbered cell strings may be arranged in a row direction (i.e., +X direction). FIG. 3 exemplarily shows the first memory block BLK1 including two cell strings arranged in a column direction (i.e., +Y direction). However, the number of cell strings arranged in the column direction may vary according to design.

Each of the plurality of cell strings CS11 to CS1$m$ and CS21 to CS2$m$ may include one or more source selection transistors SST, a plurality of memory cells SDC, NMC1 to NMCn, and DDC, a pipe transistor PT, and one or more drain selection transistors DST. The memory cells SDC, NMC1 to NMCn, and DDC may include one or more source side dummy memory cells SDC, first to n-th normal memory cells NMC1 to NMCn and one or more drain side dummy memory cells DDC.

The selection transistors SST and DST, the dummy memory cells SDC and DDC and the normal memory cells NMC1 to NMCn may have similar structures. According to an embodiment, each of the selection transistors SST and DST, the dummy memory cells SDC and DDC and the normal memory cells NMC1 to NMCn may include a channel layer, a tunneling insulating layer, a charge storage layer and a blocking insulating layer.

The first to n-th normal memory cells NMC1 to NMCn of each cell string may be coupled between the source side dummy memory cell SDC and the drain side dummy memory cell DDC.

In each of the cell strings, the first to n-th normal memory cells NMC1 to NMCn may be divided into the first to p-th normal memory cells NMC1 to NMCp and the p+1-th to n-th normal memory cells NMCp+1 to NMCn. The first to p-th normal memory cells NMC1 to NMCp and the p+1-th to n-th normal memory cells NMCp+1 to NMCn may be coupled through the pipe transistor PT.

In each of the cell strings, the normal memory cells NMC1 to NMCp, the source side dummy memory cell SDC and the source selection transistor SST may be sequentially stacked in a direction crossing the substrate (not illustrated) under the memory block BLK1, i.e., in the +Z direction. Further, in each cell string, normal memory cells NMCp+1 to NMCn, the drain side dummy memory cell DDC, and the drain selection transistor DST may be sequentially stacked in the +Z direction.

The first to p-th normal memory cells NMC1 to NMCp may be coupled in series between the source side dummy memory cell SDC and the pipe transistor PT. The p+1-th to n-th normal memory cells NMCp+1 to NMCn may be coupled in series between the pipe transistor PT and the drain side dummy memory cell DDC.

Gates of the first to n-th normal memory cells NMC1 to NMCn may be coupled to the first to n-th normal word lines NWL1 to NWLn, respectively. Data may be stored in the first to n-th normal memory cells NMC1 to NMCn through the first to m-th bit lines BL1 to BLm, respectively. The data stored in the first to n-th normal memory cells NMC1 to NMCn may be read through the first to m-th bit lines BL1 to BLm, respectively.

The source selection transistor SST of each cell string may be coupled between the common source line CSL and the source side dummy memory cell SDC. According to an embodiment, the common source line CSL may be commonly coupled to the memory blocks BLK1 to BLKz shown in FIG. 2.

According to an embodiment, the source selection transistors SST of cell strings arranged in the same row direction (+X direction), e.g., CS11 to CS1m, may be coupled to a source selection line, e.g., SSL1, extending in the row direction. The source selection transistors SST of cell strings arranged in different rows, e.g., CS11 and CS21, may be coupled to different source selection lines, e.g., SSL1 and SSL2, respectively. The source selection transistors SST of the cell strings CS11 to CS1m arranged in a first row may be coupled to the first source selection line SSL1. The source selection transistors SST of the cell strings CS21 to CS2m arranged in the second row may be coupled to the second source selection line SSL2.

The source side dummy memory cell SDC of each cell string may be coupled between the source selection transistor SST and the normal memory cells NMC1 to NMCp. Gates of source side dummy memory cells SDC having the same height in the cell strings CS11 to CS1m and CS21 to CS2m may be coupled to a single source side dummy word line SDWL.

A gate of the pipe transistor PT of each cell string may be coupled to a pipe line PL.

The drain side dummy memory cell DDC of each cell string may be coupled between the drain selection transistor DST and the normal memory cells NMCp+1 to NMCn. Gates of drain side dummy memory cells having the same height in the cell strings CS11 to CS1m and CS21 to CS2m may be coupled to a single drain side dummy word line DDWL.

The drain selection transistor DST of each cell string may be coupled between the corresponding bit line and the drain side dummy memory cell DDC. The drain selection transistors DST of cell strings arranged in the same row, e.g., CS11 to CS1m, may be coupled to a drain selection line, e.g., DSL1, extending in the row direction. The drain selection transistors DST of cell strings arranged in different rows, e.g., CS11 and CS21, may be coupled to different drain selection lines, e.g., DSL1 and DSL2, respectively. The drain selection transistors DST of the cell strings CS11 to CS1m arranged in the first row may be coupled to the first drain selection line DSL1. The drain selection transistors of the cell strings CS21 to CS2m arranged in the second row may be coupled to the second drain selection line DSL2.

Cell strings arranged in the column direction (+Y direction) may be coupled to a bit line extending in the column direction. The cell strings CS11 and CS21 in a first column may be coupled to the first bit line BL1. The cell strings CS1m and CS2m in an m-th column may be coupled to the m-th bit line BLm. In other words, cell strings CS1x and CS2x in an x-th column may be coupled to an x-th bit line BLx (where x is equal to or greater than 1 and less than or equal to m).

Instead of the first to m-th bit lines BL1 to BLm shown in FIG. 3, even bit lines and odd bit lines may be provided. Even cell strings among the cell strings CS11 to CS1m or CS21 to CS2m, which are arranged in the row direction, may be coupled to the even bit lines, respectively. Odd cell strings among the cell strings CS11 to CS1m or CS21 to CS2m, which are arranged in the row direction, may be coupled to the odd bit lines, respectively.

FIG. 4 is a circuit diagram illustrating another example of the first memory block BLK1 shown in FIG. 2.

The example or the equivalent circuit of the first memory block BLK1 shown in FIG. 4 may be the same as the memory block BLK1 described above with reference to FIG. 3, except for the pipe transistor PT.

Referring to FIG. 4, a first memory block BLK1 may include a plurality of cell strings CS11' to CS1m' and CS21' to CS2m'. Each of the plurality of cell strings CS11' to CSm' and CS21' to CS2m' may extend in the +Z direction. Each cell string stacked over a substrate (not illustrated) under the memory block BLK1 may include one or more source selection transistors SST, one or more source side dummy memory cells SDC, first to n-th normal memory cells NMC1 to NMCn one or more drain side dummy memory cells DDC, and one or more drain selection transistors DST.

The source selection transistor SST of each cell string may be coupled between the common source line CSL and the source side dummy memory cell SDC. Sources of the source selection transistors SST may be coupled in common to the common source line CSL.

According to an embodiment, source selection transistors of cell strings (e.g., CS11' to CS1m') arranged in the same row (+X direction) may be coupled to the same source selection line (e.g., SSL1). Source selection transistors of cell strings (e.g., CS11' and CS21') arranged in different rows may be coupled to different source selection lines (e.g., SSL1' and SSL2'). The source selection transistors of the cell strings CS11' to CS1m' arranged in the first row may be coupled to the first source selection line SSL1. The source selection transistors of the cell strings CS21' to CS2m' arranged in the second row may be coupled to the second source selection line SSL2.

The source side dummy memory cell SDC of each cell string may be coupled between the source selection transistor SST and the normal memory cells NMC1 to NMCn. In the cell strings CS11' to CS1m' and CS21' to CS2m', source side dummy memory cells having the same height may be coupled to the same source side dummy word line SDWL.

The first to n-th normal memory cells NMC1 to NMCn of each cell string may be coupled in series between the source side dummy memory cell SDC and the drain side dummy memory cell DDC. Normal memory cells having the same height in the cell strings CS11' to CS1m' and CS21' to CS2m' may be coupled to the same normal word line. The first to n-th normal memory cells NMC1 to NMCn may be coupled to the first to n-th normal word lines NWL1 to NWLn, respectively.

The drain side dummy memory cell DDC of each cell string may be coupled between the normal memory cells NMC1 to NMCn and the drain selection transistor DST.

The drain selection transistor DST of each cell string may be coupled between the corresponding bit line and the drain side dummy memory cell DDC. Drain selection transistors of the cell strings CS11' to CS1m' arranged in the first row may be coupled to the first drain selection line DSL1. Drain selection transistors of the cell strings CS21' to CS2m' arranged in the second row may be coupled to the second drain selection line DSL2.

Hereinafter, the memory block BLK1 described above with reference to FIG. 3 will be taken as an example of an exemplary embodiment of the present invention, which is also applicable to the memory block BLK1 described above with reference to FIG. 4.

Figure 5:
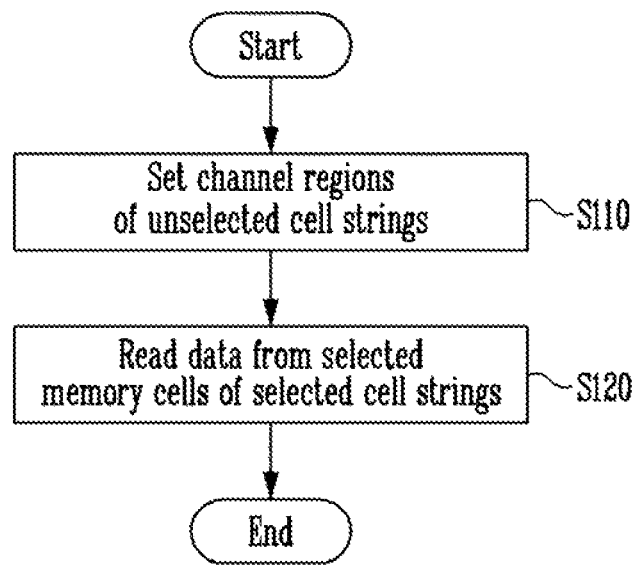
FIG. 5 is a flowchart illustrating an operating method of a semiconductor memory device in accordance with an exemplary embodiment of the present invention.

FIG. 5 is a flowchart illustrating an operating method of the semiconductor memory device 100 in accordance with an exemplary embodiment of the present invention.

Referring to FIGS. 3 and 5, at step S110, the semiconductor memory device 100 may set channel regions of unselected cell strings before a read operation.

Among the cell strings CS11 to CS1m and CS21 to CS2m, the unselected cell strings may be coupled to an unselected one among the plurality of drain selection lines DSL and an unselected one among the plurality of source selection lines SSL. Among the cell strings CS11 to CS1m and CS21 to CS2m, selected cell strings may be coupled to a selected one among the plurality of drain selection lines DSL and a selected one among the plurality of source selection lines SSL. Hereinafter, it is assumed that the first drain selection line DSL1 and the first source selection line SSL1, which are coupled to the cell strings CS11 to CS1m, are the selected drain selection line and the selected source selection line, respectively. It is also assumed that the drain selection line DSL2 and the source selection line SSL2, which are coupled to the cell strings CS21 to CS2m, are the unselected drain selection line and the unselected source selection line, respectively. In other words, it is assumed that the cell strings CS11 to CS1m are the selected cell strings and the cell strings CS21 to CS2m are the unselected cell strings.

At step S120 the semiconductor memory device 100 may read data from selected memory cells of the selected cell strings CS11 to CS1m.

Figure 6:
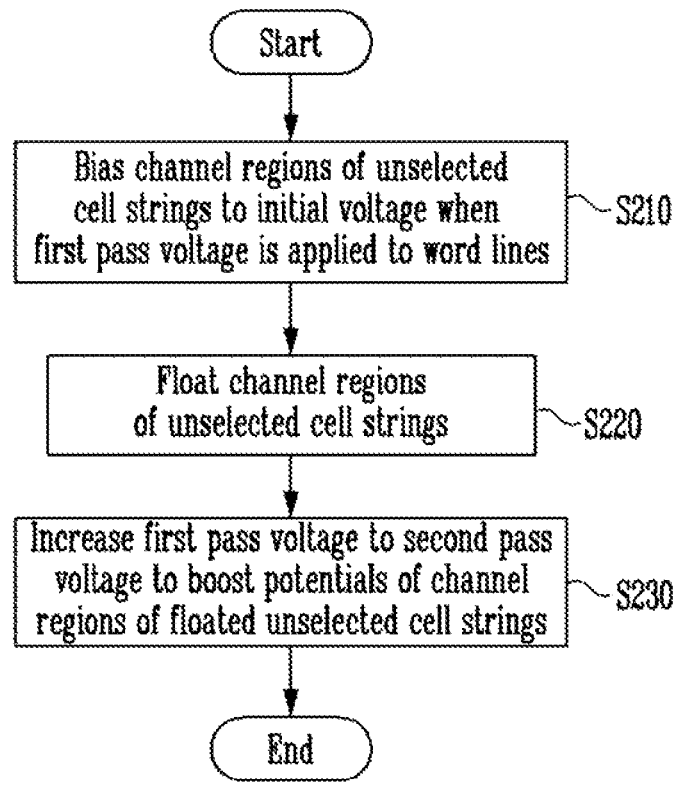
FIG. 6 is a flowchart illustrating step S110 shown in FIG. 5.

FIG. 6 is a flowchart illustrating step S110 shown in FIG. 5.

Referring to FIGS. 3 and 6, at step S210, the semiconductor memory device 100 may bias the channel regions of the unselected cell strings CS21 to CS2m to an initial voltage by applying a first pass voltage to the word lines DDWL, NWL1 to NWLn, and SDWL during electrical coupling between the unselected cell strings CS21 to CS2m and the bit lines BL1 to BLm. The initial voltage may be a low voltage. For example, the initial voltage may be a ground voltage.

The first pass voltage may turn on the memory cells SDC, NMC1 to NMCn, and DDC of the plurality of cell strings CS11 to CS1m and CS21 to CS2m regardless of threshold voltages of the memory cells. The first pass voltage may be generated by the voltage generator 122 and transferred to the word DDWL, NWL1 to NWLn, and SDWL by the address decoder 121. When the first pass voltage is applied to the word lines DDWL, NWL1 to NWLn, and SDWL, channels may be formed in channel regions of the cell strings CS11 to CS1m and CS21 to CS2m. The initial voltage may be transferred to the memory cells SDC, NMC1 to NMCn, and DDC.

According to an embodiment the channel regions of the unselected cell strings CS21 to CS2m may be biased to the initial voltage through the bit lines BL1 to BLm, respectively. In another example, the channel regions of the unselected cell strings CS21 to CS2m may be biased to the initial voltage through the common source line CSL.

At step S220, the semiconductor memory device 100 may float the channel regions of the unselected cell strings CS21 to CS2m by electrically separating the unselected cell strings CS21 to CS2m from the bit lines BL1 to BLm as well as the common source line CSL while the channel regions of the selected cell strings CS11 to CS1m are electrically coupled to bit lines BL1 to BLm.

At step S230, the semiconductor memory device 100 may boost potentials of the floated channel regions of the unselected cell strings CS21 to CS2m by increasing the first pass voltage applied to the word lines DDWL, NWL1 to NWLn, and SDWL to a second pass voltage. The voltage generator 122 may increase the first pass voltage and generate the second pass voltage in response to control of the control logic 125. The address decoder 121 may transfer the second pass voltage from the voltage generator 122 to the word lines DDWL, NWL1 to NWLn, and SDWL. The second pass voltage may keep being applied to unselected normal word lines during the read operation at step S120.

Therefore, the potentials of the floated channel regions of the unselected cell strings CS21 to CS2m may be increased to a predetermined voltage. For example, the potentials of the floated channel regions of the unselected cell strings CS21 to CS2m may be boosted in proportion to an increment from the first pass voltage to the second pass voltage.

Subsequently, a read operation may be performed on selected memory cells of the selected cell strings CS11 to CS1m while the potentials of the channel regions of the unselected cell strings CS21 to CS2m are increased to the predetermined voltage in proportion to the increment from the first pass voltage to the second pass voltage.

As described above with reference to FIG. 5, the channel regions of the unselected cell strings may be set at step S110 before the read operation of step S120. The potentials of the set channel regions may be controlled by the increment from the first pass voltage to the second pass voltage applied to the word lines. Since the channel regions of the unselected cell strings are boosted to an appropriate potential in proportion to the increment from the first pass voltage to the second pass voltage before the read operation, disturbance occurring in the memory cells of the unselected cell strings CS21 to CS2m during the read operation may be reduced.

Figure 7:
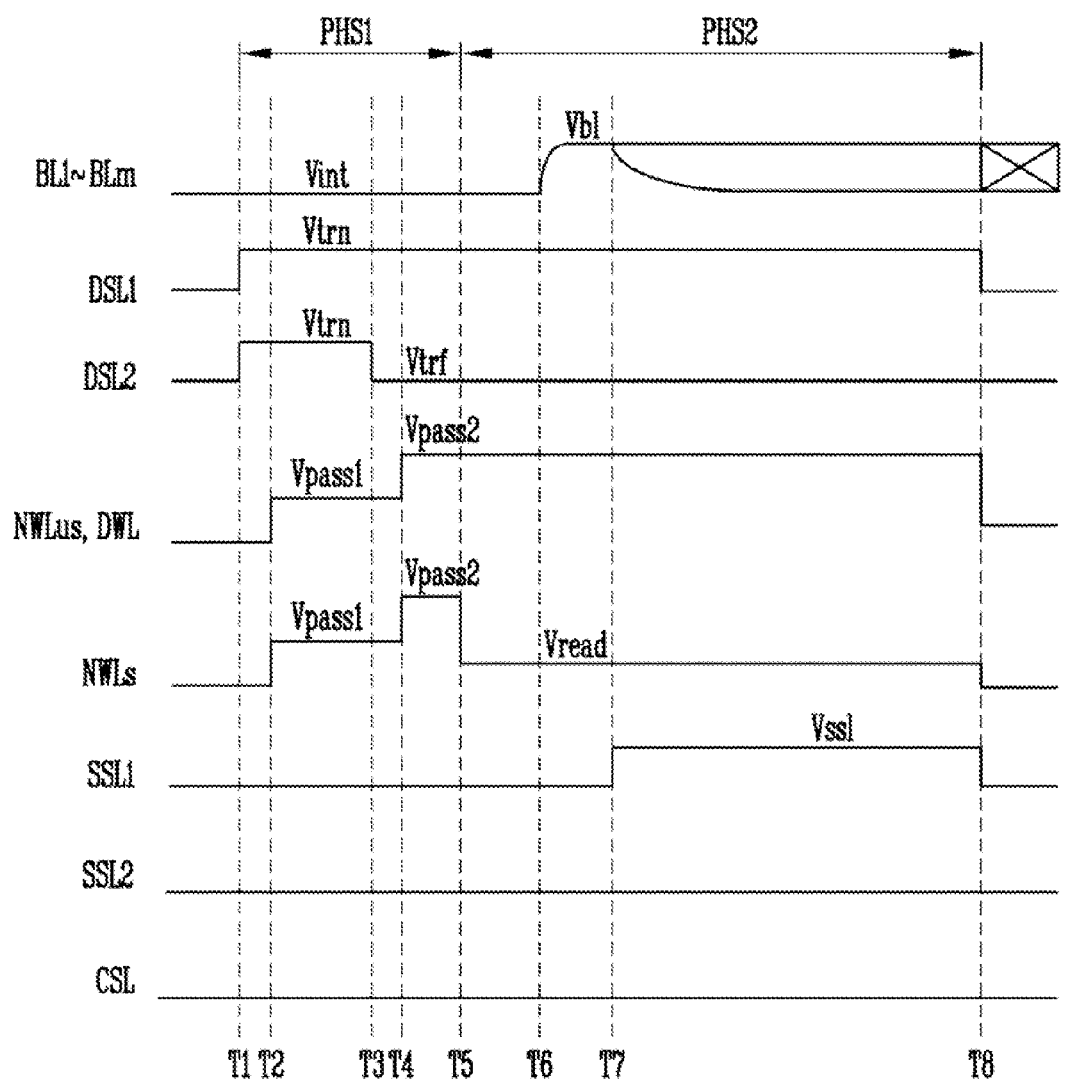
FIG. 7 is a timing diagram illustrating an example of an operating method of a semiconductor memory device in accordance with an exemplary embodiment of the present invention.

FIG. 7 is a timing diagram illustrating an example of an operating method of the semiconductor memory device 100 in accordance with an exemplary embodiment of the present invention.

Referring to FIGS. 3 and 5 to 7, the channel regions of the unselected cell strings CS21 to CS2m may be set during a first time period PHS1 at step S110 or steps S210 to S230.

An initial voltage Vint may be applied to the bit lines BL1 to BLm at a first time point T1. According to an embodiment, the initial voltage Vint may be a low voltage such as the ground voltage.

The drain selection lines DSL1 and DSL2 may receive a turn-on voltage Vtrn. Therefore, the drain selection transistors included in the cell strings CS11 to CS1m and CS21 to CS2m may be turned on. The unselected cell strings CS21 to CS2m may be electrically coupled to the bit lines BL1 to BLm, respectively. The selected cell strings CS11 to CS1m may also be electrically coupled to the bit lines BL1 to BLm, respectively.

The source selection lines SSL1 and SSL2 may receive the ground voltage. The source selection transistors included in the cell strings CS11 to CS1m and CS21 to CS2m may be turned off. The cell strings CS11 to CS1m and CS21 to CS2m may be electrically separated from the common source line CSL.

At a second time point T2, a first pass voltage Vpass1 may be applied to unselected normal word lines NWLus, among the normal word lines NWL1 to NWLn. The first pass voltage Vpass1 may be applied to the dummy word lines DWL, i.e., the source side dummy word line SDWL and the drain side dummy word line DDWL. The first pass voltage Vpass1 may be applied to a selected normal word line NWLs, among the normal word lines NWL1 to NWLn. In other words, the first pass voltage Vpass1 may be applied to the word lines DWL, NWLus, and NWLs coupled to the cell strings CS11 to CS11m and CS21 to CS2m.

The first pass voltage Vpass1 may turn on the memory cells regardless of threshold voltages of the memory cells. Since the first pass voltage Vpass1 is applied, channels may be formed in the channel regions of the cell strings CS11 to CS1m and CS21 to CS2m.

When the first pass voltage Vpass1 is applied to the word lines DWL, NWLus, and NWLs, it will be understood, not only that the same voltage is applied to the word lines DWL, NWLus, and NWLs, but that voltages treated as equivalent to the first pass voltage Vpass1 are applied to the word lines DWL, NWLus, and NWLs.

The cell strings CS11 to CS1m and CS21 to CS2m are electrically coupled to the bit lines BL1 to BLm. The initial voltage Vint of the bit lines BL1 to BLm may be transferred through the channels formed in the channel regions of the cell strings CS11 to CS1m and CS21 to CS2m. For example, the initial voltage Vint of the bit lines BL1 to BLm may be transferred to the channel regions, each of which corresponds to the drain side dummy memory cell DDC, the normal memory cells NMC1 to NMCn and the source side dummy memory cell SDC, of the unselected cell strings CS21 to CS2m as well as the selected cell strings CS11 to CS1m, respectively.

In summary, as described above with reference to step S210, the semiconductor memory device 100 may bias the channel regions of the unselected cell strings CS21 to CS2m to the initial voltage Vint by applying the first pass voltage Vpass1 to the word lines DDWL, NWL1 to NWLn, and SDWL during electrical coupling between the unselected cell strings CS21 to CS2m and the bit lines BL1 to BLm. The initial voltage may be a low voltage such as the ground voltage.

At a third time point T3, a turn-off voltage Vtrf may be applied to the unselected drain selection line DSL2. In response to the turn-off voltage Vtrf, the drain selection transistors DST of the unselected cell strings CS21 to CS2m coupled to the unselected drain selection line DSL2 may be turned off. Therefore, the channel regions of the unselected cell strings CS21 to CS2m may be electrically separated from the bit lines BL1 to BLm as well as the common source line CSL, respectively. Therefore, the channel regions of the unselected cell strings CS21 to CS2m may float.

The selected drain selection line DSL1 may be maintained at the turn-on voltage Vtrn. The selected cell strings CS11 to CS1m may be electrically connected to the bit lines BL1 to BLm.

In summary, as described above with reference to step S220, the semiconductor memory device 100 may float the channel regions of the unselected cell strings CS21 to CS2m by electrically separating the unselected cell strings CS21 to CS2m from the bit lines BL1 to BLm as well as the common source line CSL while the channel regions of the selected cell strings CS11 to CS1m are electrically coupled to the bit lines BL1 to BLm.

At a fourth time point T4, the first pass voltage Vpass1 of the word lines DWL, NWLus, and NWLs may be increased to the second pass voltage Vpass2.

The potentials of the floated channel regions of the unselected cell strings CS21 to CS2m may be boosted to the predetermined voltage by coupling with the voltage of the word lines DWL, NWLus, and NWLs. The potentials of the floated channel regions of the unselected cell strings CS21 to CS2m may be boosted in proportion to the increment from the first pass voltage Vpass1 to the second pass voltage Vpass2. Therefore, the channel regions of the unselected cell strings CS21 to CS2m may be set to the boosted voltage before the read operation.

The channel regions of the selected cell strings CS11 to CS1m may be electrically connected to the bit lines BL1 to BLm, respectively. The channel regions of the selected cell strings CS11 to CS1m may keep receiving the initial voltage Vint through the bit lines BL1 to BLm, respectively. As a result, the channel regions of the selected cell strings CS11 to CS1m may be set to the initial voltage Vint before the read operation. Since the channel regions of the selected cell strings CS11 to CS1m are set to the initial voltage Vint, the channel regions of the selected cell strings CS11 to CS1m may be stably controlled by the bit lines BL1 to BLm during the read operation, respectively.

In summary, as described above with reference to step S230, the semiconductor memory device 100 may boost potentials of the floated channel regions of the unselected cell strings CS21 to CS2m in proportion to an increment from the first pass voltage Vpass1 applied to the word lines DDWL, NWL1 to NWLn, and SDWL to the second pass voltage Vpass2.

Subsequently, during a second time period PHS2, the read operation at step S120 may be performed on the selected memory cells of the selected cell strings CS11 to CS1m.

At a fifth time point T5, a read voltage Vread may be applied to the selected normal word line NWLs. According to an embodiment, a voltage of the selected normal word line NWLs may be reduced to the read voltage Vread from the second pass voltage Vpass2. As another example different from FIG. 7, the voltage of the selected normal word line NWLs may decrease to the ground voltage from the second pass voltage Vpass2, and increase to the read voltage Vread from the ground voltage.

The voltages of the unselected normal word lines NWLus and the dummy word lines DWL may be maintained at the second pass voltage Vpass2. Therefore, the channel regions of the unselected cell strings CS21 to CS2m may maintain the boosted voltages during the read operation.

Under these conditions, the read operation may be performed by various methods. For example, the read and write circuit 123 may precharge the bit line and determine data of the selected memory cell according to whether the selected memory cell discharges the precharged voltage after the bit line is precharged. In another example, the read and write circuit 123 may keep providing current to the bit line and determine the data of the selected memory cell according to whether the selected memory cell passes the continuously provided current. A read operation of a selected memory cell that is accomplished by precharging a bit line will be taken as an example for a clear description of an exemplary embodiment of the present invention, which is also applicable to other read operation processes.

At a sixth time point T6, the bit lines BL1 to BLm may be charged to a bit line voltage Vbl. The read and write circuit 123 may charge the bit lines BL1 to BLm in response to the control logic 125.

At a seventh time point T7, a source selection line voltage Vssl may be applied to the selected source selection line SSL1. The source selection line voltage Vssl may be equal to the turn-on voltage Vtrn. The source selection line voltage Vssl may be different from the turn-on voltage Vtrn. The source selection transistors SST of the selected cell strings CS11 to CS1m coupled to the selected source selection line SSL1 may be turned on in response to the source selection line voltage Vssl. The selected cell strings CS11 to CS1m may be electrically connected to the common source line CSL.

In each of the selected cell strings CS11 to CS1m, the selected memory cell may be turned off when a threshold voltage thereof is greater than the read voltage Vread, and the selected memory cell may be turned on when the threshold voltage thereof is less than the read voltage Vread. In each of the selected cell strings CS11 to CS1m, the unselected memory cells may be turned on by the second pass voltage Vpass2 regardless of threshold voltages thereof.

The bit line voltage Vbl of the corresponding bit line may be discharged to the common source line CSL through the corresponding cell string according to whether the selected memory cell is turned on. When the threshold voltage of the selected memory cell is less than the read voltage Vread, the bit line voltage Vbl may be discharged to the common source line CSL through the corresponding cell string. When the threshold voltage of the selected memory cell is greater than the read voltage Vread, the bit line voltage Vbl may be maintained.

The read and write circuit 123 may determine the data of the selected memory cells by sensing changes in voltages of the bit lines BL1 to BLm.

At an eighth time point T8, in order to terminate the read operation, the voltages of the selected drain selection line DSL1, the word lines DWL, NWLus, and NWLs, and the selected source selection line SSL1 may be discharged to the ground voltage.

Figure 8:
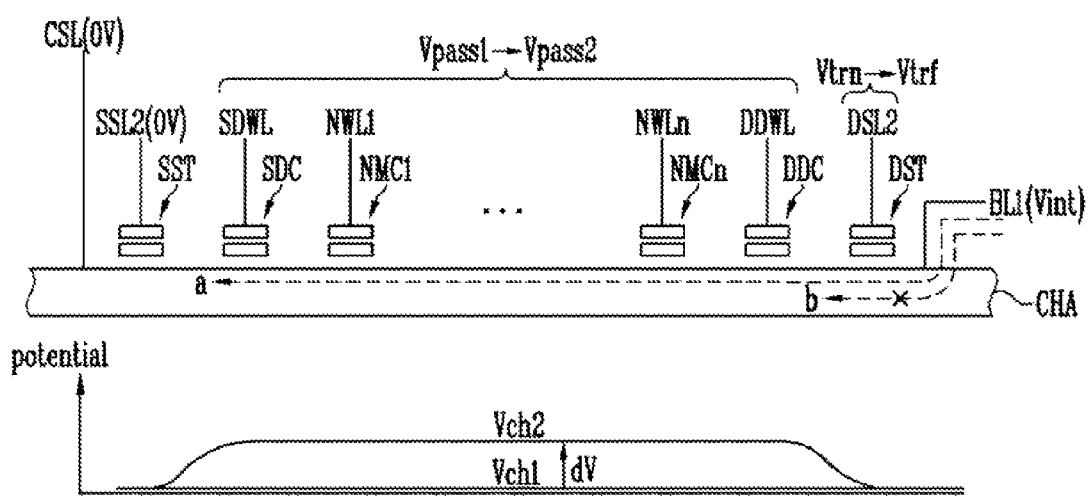
FIG. 8 is a schematic diagram illustrating an example of a channel region of unselected cell strings with reference to an example of FIG. 7.

FIG. 8 is a schematic diagram illustrating an example of a channel region CHA of the unselected cell strings CS21 to CS2m with reference to an example of FIG. 7. FIG. 8 illustrates a process of setting the channel region CHA in the unselected cell strings CS21 to CS2m according to the embodiment in FIG. 7.

Referring to FIG. 8, the turn-on voltage Vtrn may be applied to the unselected drain selection line DSL2, and the first pass voltage Vpass1 may be applied to the word lines DDWL, NWL1 to NWLn, and SDWL. The initial voltage Vint may be applied to the bit line BL1.

The drain selection transistor DST may be turned on by the turn-on voltage Vtrn. The memory cells DDC, NMC1 to NMCn, and SDC may be turned on by the first pass voltage Vpass1. Therefore, the initial voltage Vint may be applied to the channel region CHA corresponding to the drain selection transistor DST and the memory cells DDC, NMC1 to NMCn, and SDC (a). Therefore, a potential of the channel region CHA corresponding to the drain selection transistor DST and the memory cells DDC, NMC1 to NMCn, and SDC may be initialized to a first channel voltage Vch1. The first channel voltage Vch1 may be equal to the initial voltage Vint.

According to an embodiment, the ground voltage may be applied to the unselected source selection line SSL2. The channel region CHA may be electrically separated from the common source line CSL. The ground voltage may be applied to the common source line CSL.

Subsequently, the turn-off voltage Vtrf may be applied to the unselected drain selection line DSL2. The channel region CHA, initialized to the first channel voltage Vch1, may be electrically separated from the bit line BL1 (b). The channel region CHA may be floated.

The first pass voltage Vpass1 applied to the word lines DDWL, NWL1 to NWLn, and SDWL may be increased to the second pass voltage Vpass2. The channel region CHA may be boosted from the first channel voltage Vch1 to a second channel voltage Vch2 by coupling with the word lines DDWL, NWL1 to NWLn, and SDWL. The boosted potential dV from the first channel voltage Vch1 to the second channel voltage Vch2 may be in proportion to the increment from the first pass voltage Vpass1 to the second pass voltage Vpass2.

Subsequently, during the read operation, the read voltage Vread may be applied to a selected normal word line, among the word lines DDWL, NWL1 to NWLn, and SDWL, and the remaining word lines may be maintained at the second pass voltage Vpass2.

It is assumed that a voltage of a word line increases directly from the ground voltage to the second pass voltage Vpass2 without stepping to the intermediate first pass voltage Vpass1 for the read operation when the channel regions CHA of the unselected cell strings CS21 to CS2m are floated. Under the assumption, the potentials of the channel regions CHA of the unselected cell strings CS21 to CS2m may be boosted in proportion to an increment from the ground voltage to the second pass voltage Vpass2. The boosted voltage under the assumption may be greater than the boosted voltage dV between the first channel voltage Vch1 and the second channel voltage Vch2. When the voltage of the channel region CHA is boosted to a high level such, as stated in the assumption, hot carriers may be generated. For example, during the read operation, the channel region CHA corresponding to an unselected normal word line may be boosted to a high level by the second pass voltage Vpass2. On the other hand, the channel region CHA corresponding to a selected normal word line may be boosted to a low level by the read voltage Vread. Therefore, the hot carriers may be unintentionally trapped in a memory cell due to the potential difference across the channel region CHA. As a result, a threshold voltage of the arbitrary memory cell may be inadvertently increased.

According to an embodiment, the channel region CHA may be boosted to an appropriate level in proportion to the increment from the intermediate first pass voltage Vpass1 to the second pass voltage Vpass2 during the read operation. The appropriate level may be controlled by the increment from the first pass voltage Vpass1 to the second pass voltage Vpass2. Therefore, generation of hot carriers may be suppressed to prevent disturbance from occurring in the memory cells during the read operation, and reliability of the semiconductor memory device 100 may be improved.

It is assumed that the second pass voltage VPass2 is applied to a word line for the read operation when the channel regions CHA of the unselected cell strings CS21 to CS2m are not floated. According to the assumption, for example, at time point T3 shown in FIG. 7, the turn-on voltage may be applied to the unselected source selection line SSL2 so that the source selection transistor SST may be turned on, and therefore the voltage of the channel regions CHA of the unselected cell strings CS21 to CS2m may be maintained at the level ranging from the first channel voltage Vch1 to the ground voltage in response to the ground voltage from the common source line CSL. The second pass voltage VPass2 may be a high voltage. When the second pass voltage VPass2 is applied to the unselected normal word line, a threshold voltage of a normal memory cell of the unselected normal word line may be unintentionally increased due to the difference between the ground voltage and the second pass voltage Vpass2 of the channel region CHA.

According to an embodiment, the channel region CHA may be boosted to an appropriate level in proportion to the increment from the first pass voltage Vpass1 to the second pass voltage Vpass2 during the read operation. The memory cells of the unselected cell strings may not be subjected to stress corresponding to the difference between the voltage of the channel region CHA and the second pass voltage Vpass2. Therefore, during the read operation, disturbance in memory cells may be prevented, and reliability of the semiconductor memory device 100 may be improved.

Figure 9:
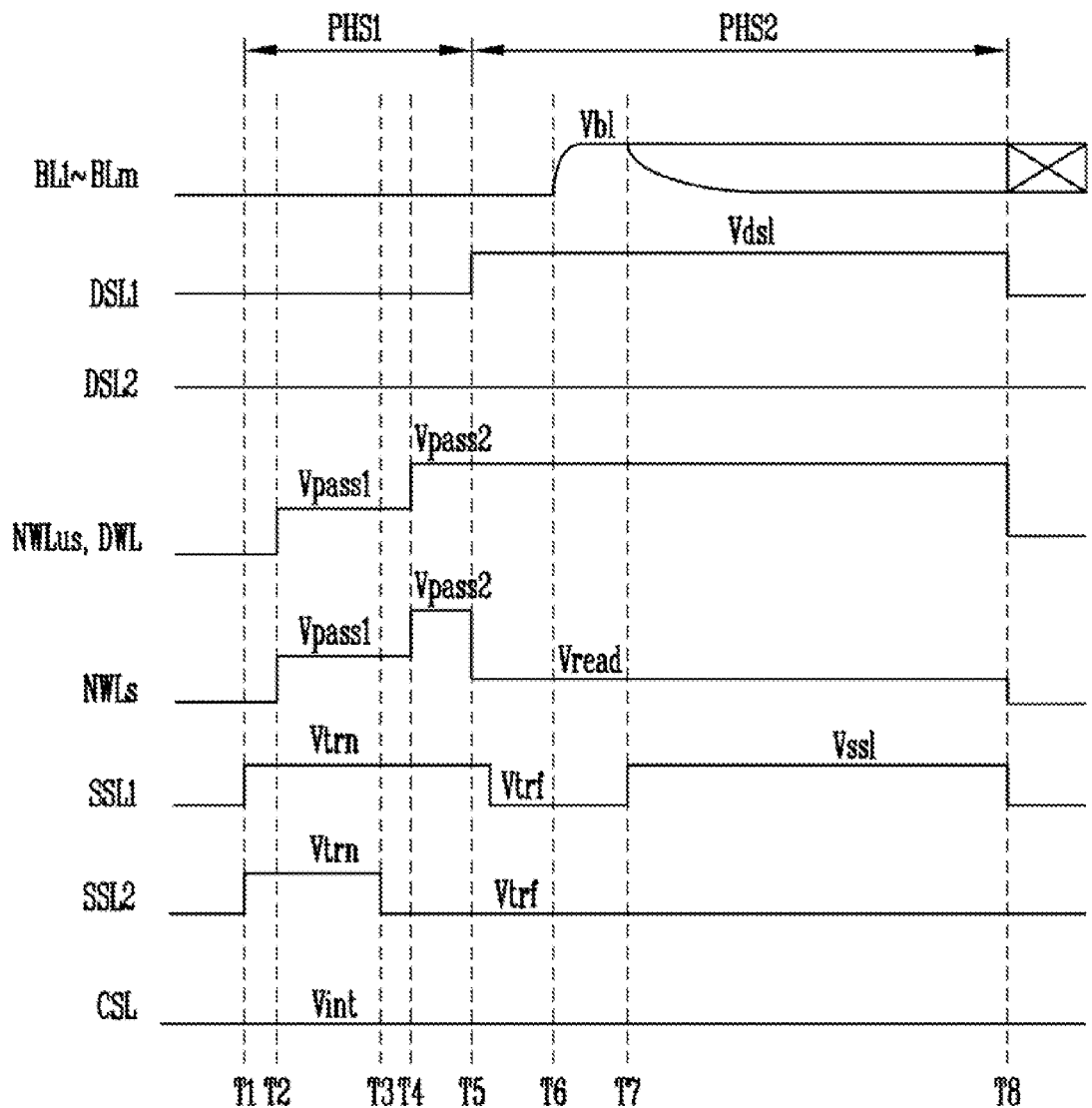
FIG. 9 is a timing diagram illustrating another example of an operating method of a semiconductor memory device in accordance with an exemplary embodiment of the present invention.

FIG. 9 is a timing diagram illustrating another example of the operating method of the semiconductor memory device 100 in accordance with an exemplary embodiment of the present invention.

Referring to FIGS. 3, 5, 6 and 9, channel regions of the unselected cell strings CS21 to CS2m may be set during the first time period PHS1 at step S110 or steps S210 to S230.

According to this embodiment, a potential of the channel region CHA, shown in FIG. 8, may be initialized through the common source line CSL instead of the bit lines BL1 to BLm. At the first time point T1, the initial voltage Vint may be applied to the common source line CSL. In addition, the turn-on voltage Vtrn may be applied to the source select lines SSL1 and SSL2. Therefore, the source selection transistors included in the cell strings CS11 to CS1m and CS21 to CS2m may be turned on. The initial voltage Vint of the common source line CSL may be transferred to the channel regions of the cell strings CS11 to CS1m and CS21 to CS2m.

The drain selection lines DSL1 and DSL2 may receive the ground voltage. The drain selection transistors included in the cell strings CS11 to CS1m and CS21 to CS2m may be turned off, and the cell strings CS11 to CS1m and CS21 to CS2m may be electrically separated from the bit lines BL1 to BLm.

At the second time point T2, the first pass voltage Vpass1 may be applied to the word lines DWL, NWLus, and NWLs. Since the first pass voltage Vpass1 is applied, channels may be formed in the channel regions of the cell strings CS11 to CS1m and CS21 to CS2m.

Therefore, as described above with reference to step S210, the semiconductor memory device 100 may bias the channel regions of the unselected cell strings CS21 to CS2m to the initial voltage Vint by applying the first pass voltage Vpass1 to the word lines DDWL, NWL1 to NWLn, and SDWL during electrical coupling between the unselected cell strings CS21 to CS2m and the common source line CSL. The initial voltage may be a low voltage such as the ground voltage.

At the third time point. T3, the turn-off voltage Vtrf may be applied to the unselected source selection line SSL2. In response to the turn-off voltage Vtrf, the source selection transistors SST of the unselected cell strings CS21 to CS2m coupled to the unselected source selection line SSL2 may be turned off. Therefore, the channel regions of the unselected cell strings CS21 to CS2m may be electrically separated from the common source line CSL as well as the bit lines BL1 to BLm. Therefore, the channel regions of the unselected cell strings CS21 to CS2m may float.

The selected source selection line SSL1 may be maintained at the turn-on voltage Vtrn. Therefore, the selected cell strings CS11 to CS1m may be electrically connected to the common source line CSL.

Therefore, as described above with reference to step S220, the semiconductor memory device 100 may float the channel regions of the unselected cell strings CS21 to CS2m by electrically separating the unselected cell strings CS21 to CS2m from the common source line CSL as well as the bit lines BL1 to BLm while the channel regions of the selected cell strings CS11 to CS1m are electrically coupled to the common source line CSL.

At the fourth time point T4, the voltages of the word lines DWL, NWLus, and NWLs may increase from the first pass voltage Vpass1 to the second pass voltage Vpass2.

The potentials of the floated channel regions of the unselected cell strings CS21 to CS2m may be boosted to the predetermined voltage by coupling with the voltage of the word lines DWL, NWLus, and NWLs. The potentials of the floated channel regions of the unselected cell strings CS21 to CS2m may be boosted in proportion to the increment from the first pass voltage Vpass1 to the second pass voltage Vpass2. Therefore, the channel regions of the unselected cell strings CS21 to CS2m may be set to the boosted voltages before the read operation.

Since the channel regions of the selected cell strings CS11 to CS1m are electrically connected to the common source line CSL, the channel regions may keep receiving the initial voltage Vint. Therefore, the channel regions of the selected cell strings CS11 to CS1m may be set to the initial voltage Vint from the common source line CSL before the read operation.

Therefore, as described above with reference to step S230, the semiconductor memory device 100 may boost potentials of the floated channel regions of the unselected cell strings CS21 to CS2m in proportion to an increment from the first pass voltage Vpass1 applied to the word lines DDWL, NWL1 to NWLn, and SDWL to the second pass voltage Vpass2.

During the second time period PHS2, the read operation at step S120 may be performed on the selected memory cells of the selected cell strings CS11 to CS1m. During the second time period PHS2, the drain selection lines DSL1 and DSL2 and the source selection lines SSL1 and SSL2 may be biased to have substantially the same voltage conditions as those described with reference to FIG. 7.

At the fifth time point T5, the drain selection line voltage Vdsl may be applied to the selected drain selection line DSL1. The drain selection line voltage Vdsl may be equal to the turn-on voltage Vtrn. The drain selection line voltage Vdsl may be different from the turn-on voltage Vtrn. The drain selection transistors of the selected cell strings CS11 to CS1m may be turned on by the drain selection line voltage Vdsl, and the selected cell strings CS11 to CS1m may be electrically connected to the bit lines BL1 to BLm. The unselected drain selection line DSL2 may maintain the turn-off voltage, e.g., the ground voltage.

The read voltage Vread may be applied to the selected normal word line NWLs, and the word lines NWLus and DWL may be maintained at the second pass voltage Vpass2.

The selected source selection line SSL1 may be reduced from the turn-on voltage Vtrn to the turn-off voltage Vtrf. The source selection transistors of the selected cell strings CS11 to CS1m may be turned off. According to an embodiment, the time at which the voltage of the selected source selection line SSL1 decreases from the turn-on voltage Vtrn to the turn-off voltage Vtrf may be later than the time at which the second pass voltage Vpass2 is discharged. Therefore, the channel regions of the selected cell strings CS11 to CS1m may not be boosted by the second pass voltage Vpass2 and maintain the initial voltage Vint from the common source line CSL.

The read voltage Vread may be applied to the selected normal word line NWLs, and the word lines NWLus and DWL may be maintained at the second pass voltage Vpass2.

The unselected source selection line SSL2 may maintain the turn-off voltage Vtrf.

The operation of the semiconductor device 100 at the sixth to eighth time points T6 to T8 may be the same as the sixth to eighth time points T6 to T8 described above with reference to FIG. 7. At the sixth time point T6, the bit lines BL1 to BLm may be precharged to the bit line voltage Vbl. At the seventh time point T7, the source selection line voltage Vssl may be applied to the selected source selection line SSL1. The bit line voltage Vbl of the bit lines BL1 to BLm may be maintained or reduced. The read operation may be terminated at the eighth time point T8.

Figure 10:
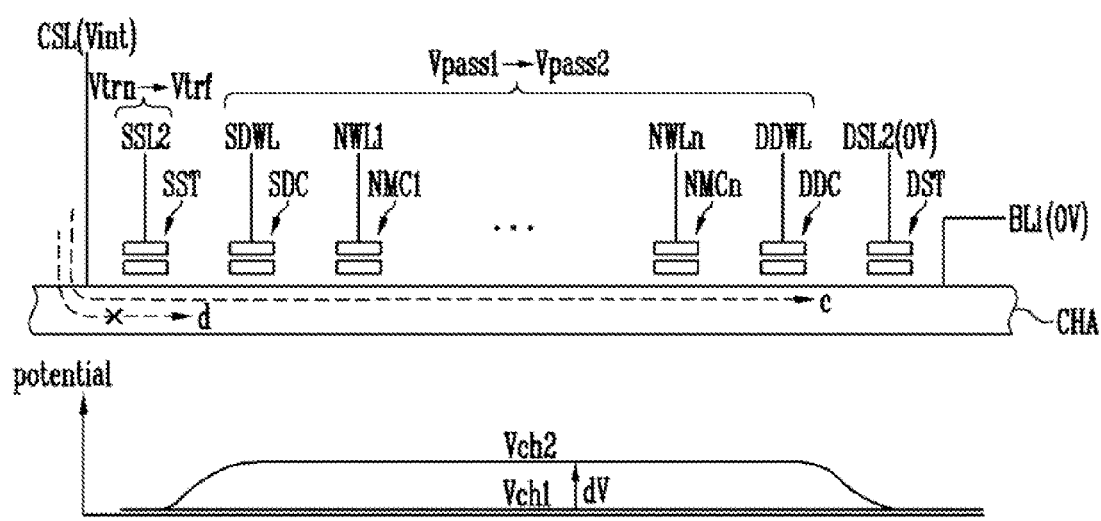
FIG. 10 is a schematic diagram illustrating another example of a channel region of unselected cell strings with reference to an example of FIG. 9.

FIG. 10 is a schematic diagram illustrating another example of the channel region CHA of the unselected cell strings CS21 to CS2m with reference to an example of FIG. 9. FIG. 10 illustrates a process of setting the channel region CHA in the unselected cell strings CS21 to CS2m according to the embodiment of FIG. 9.

Referring to FIG. 10, the turn-on voltage Vtrn may be applied to the unselected source selection line SSL2, and the first pass voltage Vpass1 may be applied to the word lines DDWL, NWL1 to NWLn, and SDWL. The initial voltage Vint may be applied to the common source line CSL.

The source selection transistor SST may be turned on by the turn-on voltage Vtrn. The memory cells DDC, NMC1 to NMCn, and SDC may be turned on by the first pass voltage Vpass1. The initial voltage Vint from the common source line CSL may be transferred to the channel region CHA corresponding to the source selection transistor SST and the memory cells DDC, NMC1 to NMCn, and SDC (a). A potential of the channel region CHA corresponding to the source selection transistor SST and the memory cells DDC, NMC1 to NMCn, and SDC may be initialized to the first channel voltage Vch1.

According to an embodiment, the ground voltage may be applied to the unselected drain selection line DSL2, and the ground voltage may be applied to the bit line BL1. The unselected cell strings CS21 to CS2m may be electrically separated from the bit line BL1.

Subsequently, the turn-off voltage Vtrf may be applied to the unselected source selection line SSL2. Therefore, the channel region CHA initialized to the first channel voltage Vch1 may be electrically separated from the common source line CSL (d). The channel region CHA may be floated.

The first pass voltage Vpass1 applied to the word lines DDWL, NWL1 to NWLn and SDWL may be increased to the second pass voltage Vpass2. The channel region CHA may be boosted to the second channel voltage Vch2 by coupling with the voltages of the word lines DDWL, NWL1 to NWLn, and SDWL. The boosted potential dV from the first channel voltage Vch1 to the second channel voltage Vch2 may be in proportion to the increment from the first pass voltage Vpass1 to the second pass voltage Vpass2.

Subsequently, during the read operation, the read voltage Vread may be applied to a selected normal word line, among the word lines DDWL, NWL1 to NWLn, and SDWL. The remaining word lines may be maintained at the second pass voltage Vpass2.

Figure 11:
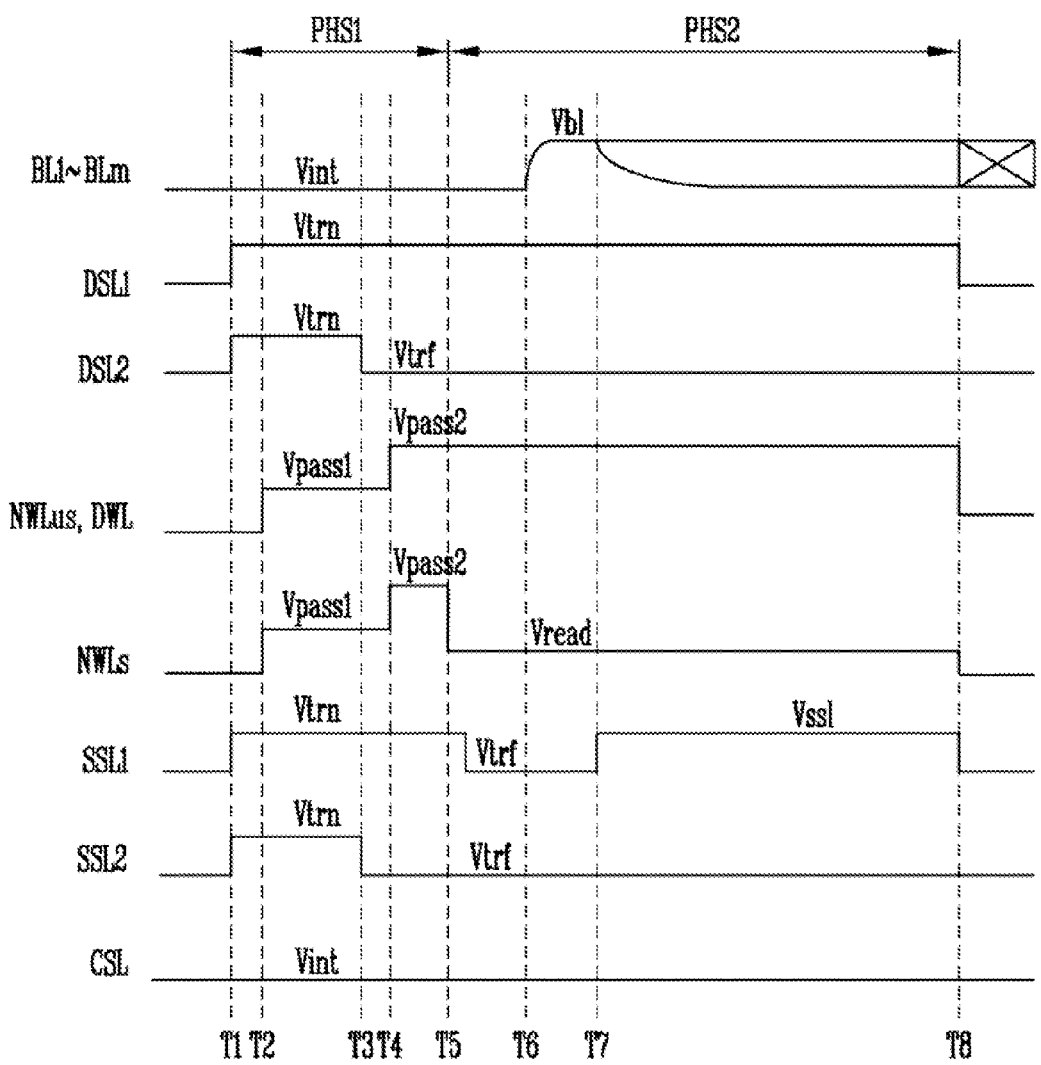
FIG. 11 is a timing diagram illustrating another example of an operating method of a semiconductor memory device in accordance with an exemplary embodiment of the present invention.

FIG. 11 is a timing diagram illustrating another example of the operating method of the semiconductor memory device 100 in accordance with an exemplary embodiment of the present invention.

Referring to FIGS. 3, 5, 6 and 11, channel regions of the unselected cell strings CS21 to CS2m may be set during the first time period PHS1.

According to this embodiment, a potential of the channel region CHA may be initialized through both of the bit lines BL1 to BLm and the common source line CSL. The turn-on voltage Vtrn may be applied to the drain selection lines DSL1 and DSL2 as described with reference to FIG. 7. The turn-on voltage Vtrn may be applied to the source selection lines SSL1 and SSL2 as described with reference to FIG. 9.

At the first time point T1, the initial voltage Vint may be applied to the bit lines BL1 to BLm, and the turn-on voltage Vtrn may be applied to the drain selection lines DSL1 and DSL2. The initial voltage Vint may be applied to the common source line CSL, and the turn-on voltage Vtrn may be applied to the source selection lines SSL1 and SSL2. At the second time point T2, the first pass voltage Vpass1 may be applied to the word lines DWL, NWLus, and NWLs. Therefore, the channel region corresponding to the memory cells DDC, NMC1 to NMCn, and SDC of each cell string may be initialized to the initial voltage Vint from the corresponding bit line and the common source line CSL. Therefore, as described above with reference to step S210, the semiconductor memory device 100 may bias the channel regions of the unselected cell strings CS21 to CS2m to the initial voltage Vint by applying the first pass voltage Vpass1 to the word lines DDWL, NWL1 to NWLn, and SDWL during electrical coupling between the unselected cell strings CS21 to CS2m and the bit lines BL1 to BLm and the common source line CSL. The initial voltage may be a low voltage such as the ground voltage.

At the third time point T3, the turn-off voltage Vtrf may be applied to the unselected drain selection line DSL2 and the unselected source selection line SSL2. The unselected cell strings CS21 to CS2m may be floated. The selected drain selection line DSL1 and the selected source selection line SSL1 may be maintained at the turn-on voltage Vtrn. The selected cell strings CS21 to CS2m may keep receiving the initial voltage Vint from the bit lines BL1 to BLm and the common source line CSL. Therefore, as described above with reference to step S220, the semiconductor memory device 100 may float the channel regions of the unselected cell strings CS21 to CS2m by electrically separating the unselected cell strings CS21 to CS2m from the common source line CSL as well as the bit lines BL1 to BLm while the channel regions of the selected cell strings CS11 to CS1m are electrically coupled to both of the bit lines BL1 to BLm and the common source line CSL.

At the fourth time point T4, the voltages of the word lines DWL, NWLus, and NWLs may increase from the first pass voltage Vpass1 to the second pass voltage Vpass2. The potentials of the channel regions of the unselected cell strings CS21 to CS2m may be boosted to the predetermined voltage by coupling with the voltage of the word lines DWL, NWLus, and NWLs. The potentials of the floated channel regions of the unselected cell strings CS21 to CS2m may be boosted in proportion to the increment from the first pass voltage Vpass1 to the second pass voltage Vpass2. Therefore, the channel regions of the unselected cell strings CS21 to CS2m may be set to the boosted voltages before the read operation. Further, as described above with reference to step S230, the semiconductor memory device 100 may boost potentials of the floated channel regions of the unselected cell strings CS21 to CS2m in proportion to an increment from the first pass voltage Vpass1 applied to the word lines DDWL, NWL1 to NWLn, and SDWL to the second pass voltage Vpass2.

During the second time period PHS2, the read operation at step S120 may be performed on the selected memory cells of the selected cell strings CS11 to CS1m.

At the fifth time point T5, the read voltage Vread may be applied to the selected normal word line NWLs, and the remaining word lines NWLus and DWL may be maintained at the second pass voltage Vpass2. The selected source selection line SSL1 may decrease from the turn-on voltage Vtrn to the turn-off voltage Vtrf. The source selection transistors of the selected cell strings CS11 to CS1m may be turned off.

Subsequently, at the sixth time point T6, the bit lines BL1 to BLm may be precharged. At the seventh time point T7, the turn-on voltage Vtrn may be applied to the selected source selection line SSL1, and the threshold voltages of the selected memory cells may be reflected on the bit lines BL1 to BLm. At the eighth time point T8, the read operation may be terminated.

Figure 12:
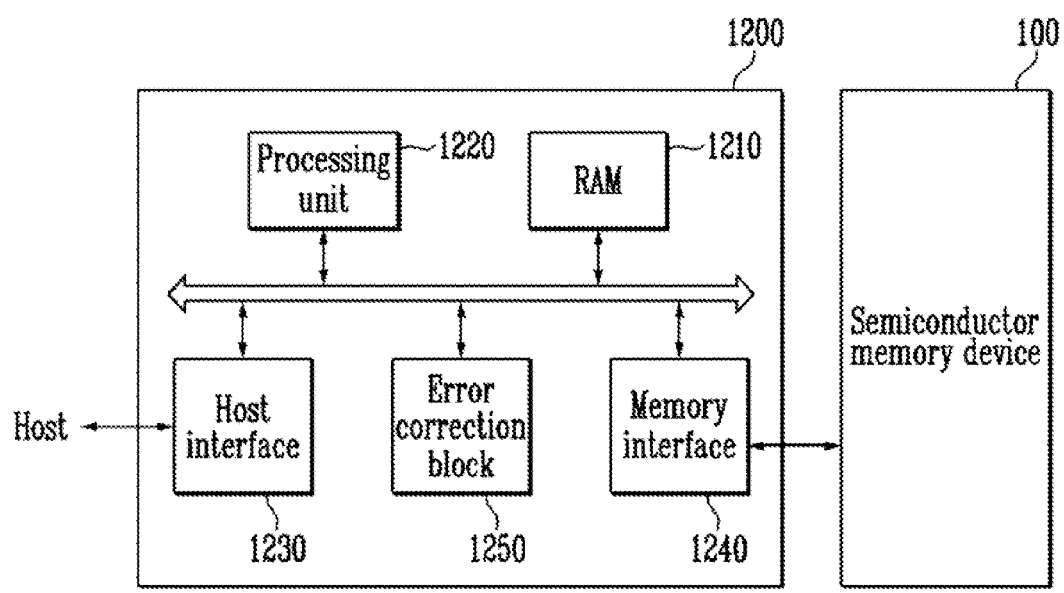
FIG. 12 is a block diagram illustrating a memory system including a semiconductor memory device shown in FIG. 1.

FIG. 12 is a block diagram illustrating a memory system 1000 including the semiconductor memory device 100 shown in FIG. 1.

Referring to FIG. 12, the memory system 1000 may include the semiconductor memory device 100 and a controller 1200.

The semiconductor memory device 100 may be configured and operated in substantially the same manner as described above with reference to FIG. 1. Thus, a detailed description thereof will be omitted.

The controller 1200 may be coupled to a host and the semiconductor memory device 100. The controller 1200 may access the semiconductor memory device 100 at the request of the host. For example, the controller 1200 may control a read operation, a program operation, an erase operation, and/or a background operation of the semiconductor memory device 100. The controller 1200 may provide an interface between the semiconductor memory device 100 and the host. The controller 1200 may drive firmware for controlling the semiconductor memory device 100.

The controller 1200 may include a random access memory (RAM) 1210, a processing unit 1220, a host interface 1230, a memory interface 1240 and an error correction block 1250.

The RAM 1210 may be used as operation memory of the processing unit 1220, a cache memory between the semiconductor memory device 100 and the host, and/or a buffer memory between the semiconductor memory device 100 and the host.

The processing unit 1220 may control operations of the controller 1200.

The host interface 1230 may include a protocol for exchanging data between the host and the controller 1200. For example, the controller 1200 may communicate with the host through one or more various protocol such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a private protocol, etc.

The memory interface 1240 may interface with the semiconductor memory device 100. For example, the memory interface may include a NAND flash interface or a NOR flash interface.

The error correction block 1250 may detect and correct errors in data read from the semiconductor memory device 100 by using an error correction code (ECC).

The controller 1200 and the semiconductor memory device 100 may be integrated in one semiconductor device. According to an embodiment, the controller 1200 and the semiconductor memory device 100 may be integrated in a single semiconductor device to form a memory card such as a PC card (personal computer memory card international association (PCMCIA)), a compact flash card (CF), a smart media card (SMC), a memory stick, a multimedia card (MMC, RS-MMC or MMCmicro), an SD card (SD, miniSD, micro SD or SDHC), a universal flash storage device (UFS), etc.

The controller 1200 and the semiconductor memory device 100 may be integrated in a single semiconductor device to form a solid state drive (SSD). The SSD may include a storage device for storing data in a semiconductor memory device. When the memory system 1000 is used as an SSD, operational rates of the host coupled to the memory system 1000 may be significantly improved.

In another example, the memory system 1000 may be used as one of several elements in various electronic devices such as a computer, an ultra mobile PC (UMPC), a workstation, a net-book, a personal digital assistant (PDA), a portable computer, a web table, a wireless phone, a mobile phone, a smart phone, an e-book, a portable multimedia player (PMP), a portable game machine, a navigation device, a black box, a digital camera, a three-dimensional television, a digital audio recorder, a digital audio player, a digital picture recorder, a digital picture player, a digital video recorder, a digital video player, a device for transmitting/receiving information in wireless environments, devices for home networks, devices for computer networks, devices for telematics networks, an RFID device, other devices for computing systems, etc.

According to an exemplary embodiment, the semiconductor memory device 100 or the memory system 1000 may be packaged in various forms. For example, the semiconductor memory device 100 or the memory system 1000 may be packaged by various methods such as a package on package (PoP), a ball grid array (BGA), a chip scale package (CSP), a plastic leaded chip carrier (PLCC), a plastic dual in line package (PDIP), a die in waffle pack, a die in wafer form, a chip on board (COB), a ceramic dual in line package (CERDIP), a plastic metric quad flat package (MQFP), a thin quad flat package (TQFP), a small outline integrated circuit (SOIC), a shrink small outline package (SSOP), a thin small outline package (TSOP), a system in package (SIP), a multi chip package (MCP), a wafer-level fabricated package (WFP), a wafer-level processed stack package (WSP), etc.

Figure 13:
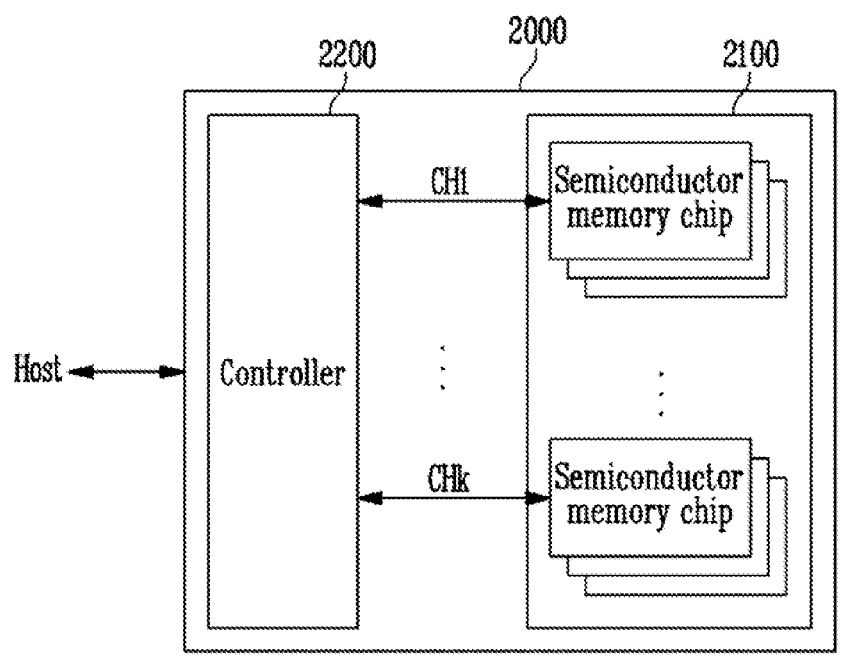
FIG. 13 is a block diagram illustrating an application example of a memory system shown in FIG. 12.

FIG. 13 is a block diagram illustrating an application example 2000 of the memory system 1000 shown in FIG. 12.

Referring to FIG. 13, a memory system 2000 may include a semiconductor memory device 2100 and a controller 2200. The semiconductor memory device 2100 may include semiconductor memory chips. The semiconductor memory chips may be divided into groups.

FIG. 13 illustrates the groups communicating with the controller 2200 through first to k-th channels CH1 to CHk. Each of the semiconductor memory chips may be configured and operated in substantially the same manner as the semiconductor memory device 100 described above with reference to FIG. 1.

Each group may communicate with the controller 2200 through a single common channel. The controller 2200 may be configured in substantially the same manner as the controller 1200 described with reference to FIG. 12, and configured to control the plurality of memory chips of the semiconductor memory device 2100.

As illustrated in FIG. 13, a plurality of semiconductor memory chips may be coupled to a single channel. However, the memory system 2000 may be modified so that a single semiconductor memory chip may be coupled to a single channel.

Figure 14:
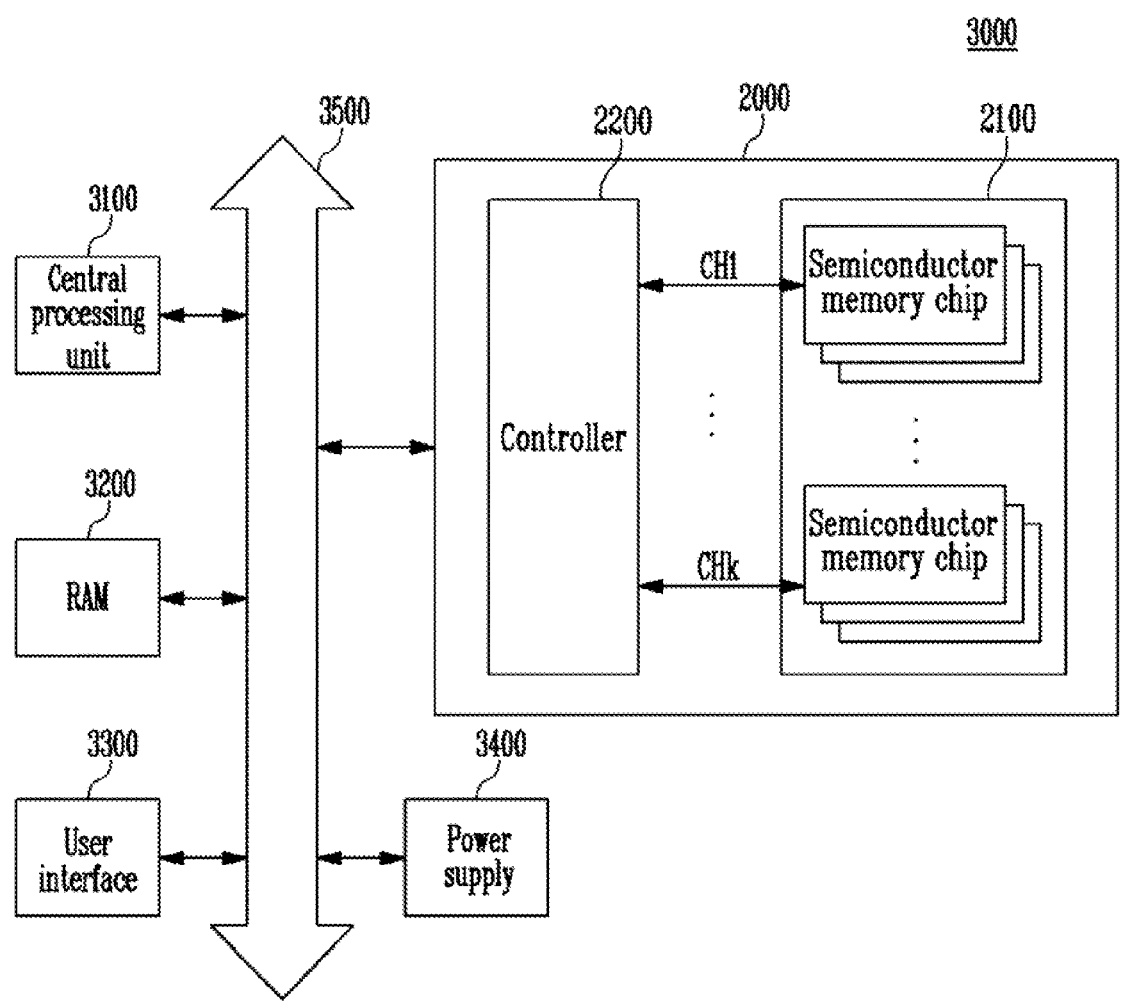
FIG. 14 is a block diagram illustrating a computing system including a memory system shown in FIG. 13.

FIG. 14 is a block diagram illustrating a computing system 3000 having the memory system 2000 described above with reference to FIG. 13.

Referring to FIG. 14, the computing system 3000 may include a central processing unit 3100, a random access memory (RAM) 3200, a user interface 3300, a power supply 3400, a system bus 3500, and a memory system 2000.

The memory system 2000 may be electrically connected to the central processing unit 3100, the RAM 3200, the user interface 3300 and the power supply 3400 through the system bus 3500. Data provided through the user interface 3300 or processed by the central processing unit 3100 may be stored in the memory system 2000.

In FIG. 14, the semiconductor memory device 2100 may be coupled to the system bus 3500 through the controller 2200. However, the semiconductor memory device 2100 may be directly coupled to the system bus 3500. The central processing unit 3100 and the RAM 3200 may perform functions of the controller 2200.

As illustrated in FIG. 14, the memory system 2000 shown in FIG. 13 may be included as the memory system 3000. However, the memory system 2000 may be replaced with the memory system 1000 shown in FIG. 12. According to an embodiment, the computing system 3000 may include both of the memory systems 1000 and 2000 described above with reference to FIGS. 12 and 13.

According to an embodiment of the present invention, a semiconductor memory device having improved reliability and an operating method thereof are provided.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. An operating method of a three-dimensional semiconductor memory device including cell strings each having memory cells stacked over a substrate and coupled to a plurality of word lines, the operating method comprising:
    biasing channel regions of unselected cell strings among the cell strings to an initial voltage while applying a first pass voltage to the plurality of word lines;
    floating the channel regions of the unselected cell strings;
    increasing the first pass voltage to a second pass voltage during the floating of the channel regions; and
    reading data from selected memory cells of selected cell strings among the cell strings.

2. The operating method of claim 1, wherein the increasing increases the first pass voltage to the second pass voltage so that potentials of the channel regions of the unselected cell strings are boosted in proportion to an increment from the first pass voltage to the second pass voltage.

3. The operating method of claim 1,
    wherein the cell strings are coupled between bit lines and a common source line, and
    wherein the floating electrically separates the channel regions of the unselected cell strings from the bit lines and the common source line.

4. The operating method of claim 1,
    wherein the cell strings are coupled between bit lines and a common source line, and
    wherein the biasing comprises:
        applying the initial voltage to the bit lines; and
        electrically connecting the channel regions of the unselected cell strings to the bit lines, thereby transferring the initial voltage to the channel regions of the unselected cell strings.

5. The operating method of claim 4, wherein the biasing further comprises applying the first pass voltage to the plurality of word lines after the electrical connecting.

6. The operating method of claim 1,
    wherein the cell strings are coupled between bit lines and a common source line, and the biasing comprises:
        applying the initial voltage to a common source line; and
        electrically connecting the channel regions of the unselected cell strings to the common source line, thereby transferring the initial voltage to the channel regions of the unselected cell strings.

7. The operating method of claim 6, wherein the biasing further comprises applying the first pass voltage to the plurality of word lines after the electrical connecting.

8. The operating method of claim 1,
    wherein the cell strings are coupled between bit lines and a common source line, and the biasing comprises:
        applying the initial voltage to both of the bit lines and the common source line; and
        electrically connecting the channel regions of the unselected cell strings to both of the bit lines and the common source line, thereby transferring the initial voltage to the channel regions of the unselected cell strings.

9. The operating method of claim 1, wherein the reading keeps the channel regions of the unselected cell strings floated.

10. The operating method of claim 1,
    wherein the reading keeps applying the second voltage to unselected word lines among the plurality of word lines, and applies a read voltage to a selected word line among the plurality of word lines, and
    wherein the first and second pass voltages are greater than the read voltage.

11. The operating method of claim 1,
    wherein the biasing provides the initial voltage to channel regions of the selected cell strings, and
    wherein the floating keeps providing the initial voltage to the channel regions of the selected cell strings.

12. The operating method of claim 11,
    wherein the cell strings are coupled between bit lines and a common source line, and
    wherein the biasing comprises:
        applying the initial voltage to the bit lines; and
        electrically connecting channel regions of the cell strings to the bit lines.

13. The operating method of claim 12, wherein the floating electrically separates the unselected cell strings from both of the bit lines and the common source line, and electrically couples the selected cell strings to the bit lines.

14. The operating method of claim 11,
wherein the cell strings are coupled between bit lines and a common source line, and
wherein the biasing comprises:
applying the initial voltage to the common source line; and
electrically connecting channel regions of the cell strings to the common source line.

15. The operating method of claim 14, wherein the floating electrically separates the unselected cell strings from both of the bit lines and the common source line, and electrically couples the selected cell strings to the common source line.

16. A semiconductor memory device, comprising:
cell strings including memory cells stacked over a substrate and coupled to a plurality of word lines; and
a peripheral circuit coupled to the cell strings through the plurality of word lines, and configured to set channel regions of unselected cell strings among the cell strings before a read operation,
wherein the peripheral circuit is further configured to:
bias the channel regions of the unselected cell strings to an initial voltage while applying a first pass voltage to the plurality of word lines;
float the channel regions of the unselected cell strings immediately after biasing the channel regions of the unselected cell strings; and
increases the first pass voltage to a second pass voltage.

17. The semiconductor memory device of claim 16,
wherein the cell strings are coupled between bit lines and a common source line, and
wherein the peripheral circuit floats the channel regions of the unselected cell strings by electrically separating the channel regions of the unselected cell strings from the bit lines and the common source line.

18. The semiconductor memory device of claim 16,
wherein the cell strings are coupled between bit lines and a common source line, and
the peripheral circuit biases the channel regions of the unselected cell strings to the initial voltage by applying the initial voltage to the bit lines, and by electrically connecting the channel regions of the unselected cell strings to the bit lines.

19. The semiconductor memory device of claim 16,
wherein the cell strings are coupled between bit lines and a common source line, and
the peripheral circuit biases the channel regions of the unselected cell strings to the initial voltage by applying the initial voltage to the common source line, and by electrically connecting the channel regions of the unselected cell strings to the common source line.

20. The semiconductor memory device of claim 16,
wherein the cell strings are coupled between bit lines and a common source line, and
the peripheral circuit biases the channel regions of the unselected cell strings to the initial voltage by applying the initial voltage to both of the bit lines and the common source line, and by electrically connecting the channel regions of the unselected cell strings to the bit lines and the common source line.

* * * * *